United States Patent [19]

Wawersig et al.

[11] Patent Number: 4,602,353
[45] Date of Patent: Jul. 22, 1986

[54] INTEGRATED SEMICONDUCTOR CIRCUIT WITH A DYNAMIC READ-WRITE MEMORY

[75] Inventors: Jürgen Wawersig; Dieter Kantz, both of Munich, Fed. Rep. of Germany

[73] Assignee: Siemens Aktiengesellschaft, Berlin and Munich, Fed. Rep. of Germany

[21] Appl. No.: 554,432

[22] Filed: Nov. 21, 1983

[30] Foreign Application Priority Data

Nov. 24, 1982 [DE] Fed. Rep. of Germany ....... 3243496

[51] Int. Cl.[4] .............................................. G11C 7/00
[52] U.S. Cl. .................................... 365/189; 365/193
[58] Field of Search ............... 365/189, 190, 191, 193, 365/194, 230, 221, 239, 240

[56] References Cited

U.S. PATENT DOCUMENTS 4,397,001 8/1983 Takemae ............................ 365/189

Primary Examiner—Joseph A. Popek
Attorney, Agent, or Firm—Herbert L. Lerner; Laurence A. Greenberg

[57] ABSTRACT

Integrated semiconductor circuit with a dynamic read-write memory having a memory matrix composed of identical memory cells addressable via row and column decoders with respect to the individual memory cells, the addressing of the individual matrix rows being initiated by a row address strobe while the addressing of the individual matrix columns is initiated by a column address strobe, the addressing being such that during readout, simultaneously, the information contents of at least two of the memory cells intended for data storage is processed and temporarily stored in an interim register, and including, in addition, a shift register exclusively operated by the column address strobe for the serial transmission of the information contents simultaneously obtained from the memory matrix to the data output of the memory, including means for controlling the data output of the memory via the column address strobe so that the information present at the data output of the memory and made available by the shift register is preserved at the data output of the memory after decay of the column address strobe signal causing readout of the information for a defined time span.

21 Claims, 17 Drawing Figures

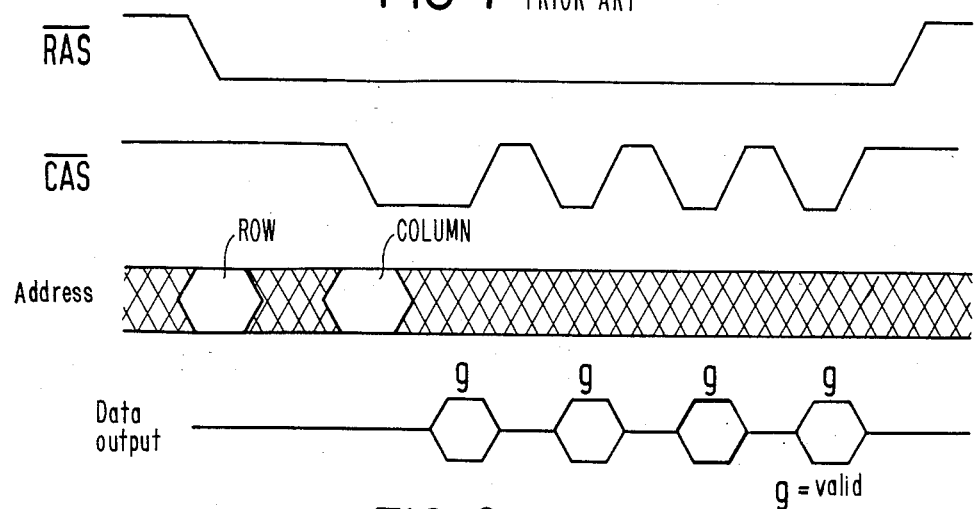
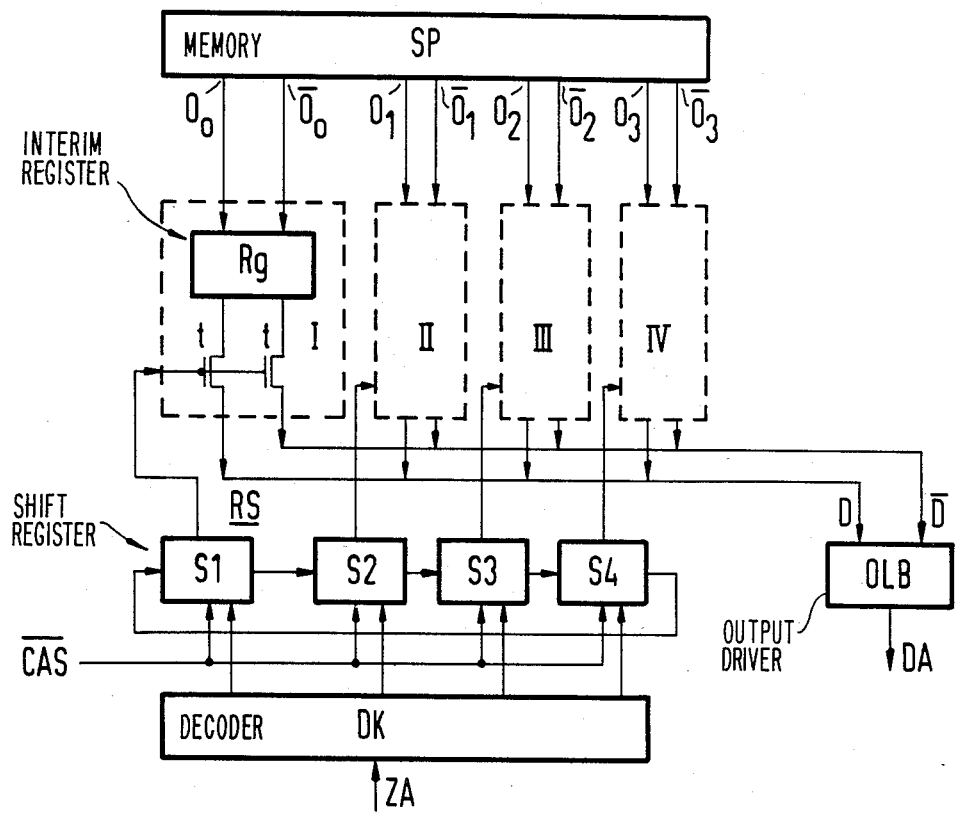

INTEGRATED SEMICONDUCTOR CIRCUIT WITH A DYNAMIC READ-WRITE MEMORY

The invention relates to an integrated semiconductor circuit with a dynamic read-write memory, wherein a memory matrix, composed of identical memory cells, and more particularly single transistor memory cells, is addressable via row and column decoders with respect to the individual memory cells, the addressing of the individual matrix rows being initiated by a row address strobe while the addressing of the individual matrix columns is initiated by a column address strobe, and wherein the addressing is devised so that during read-out, the information contents of at least two of the memory cells intended for data storage is simultaneously processed and temporarily stored in an interim register and, in addition, including a shift register operated exclusively by the column address strobe for serial transmission of the information contents simultaneously obtained from the memory matrix to the data output of the memory.

In many dynamic read-write memories (i.e. so-called DRAMs) each cycle begins, as is generally known, with a Row Address Strobe $\overline{RAS}$, which reads-in all row addresses via the address lines and temporarily stores them. At least one of the provided matrix rows is selected, the memory cells along this row being switched, by appropriate addressing of the respective column lines (=bit lines), to the read amplifiers belonging to the individual column lines. These amplifiers pick up the digital information entered in the respective addressed memory cells, this information being thus temporarily stored and made available for the data output of the memory. Upon completion of the respective read-out cycle, the temporarily stored information is then returned by the respective read amplifier to the addressed memory cell, with the result that, due to the row address strobe $\overline{RAS}$, the information entered in the respective memory cell is regenerated entirely independently of the associated column address strobe $\overline{CAS}$.

The second part of each access is initiated by the $\overline{CAS}$ (column address strobe), which reads-in and stores the column addresses (=bit line addresses). In accordance with the row address strobe $\overline{RAS}$ the decoding in controlled also by the column address strobe $\overline{CAS}$. It activates the read amplifier belonging to the addressed column line which, as has been indicated, is effective as a temporary memory, and it switches the terminal of the temporary memory, which is connected to the addressed memory cell, to an interim register which serves simultaneously for amplifying the data again.

It has become known heretofore (cf. "1981 IEEE International Solid State Circuits Conference", Pages 84 and 85, respectively "Elektronik" 15/30 July 1982, Pages 27 to 30) to construct such a DRAM memory so that it corresponds to the above definition. Because such memories are usually produced with n-channel MOS technology, the falling edges of the controlling clock pulses are responsible for the activation phase. The operating mode cited in the above definition, wherein not only the content of a single cell but, due to the appropriate addressing arrangement, also the data content of at least one additional memory cell can be delivered to the data output, is referred to as the "nibble mode" if four bits, respectively, are made available serially. Then also there is the "BYTE mode" with which, for each addressing, a data word consisting of eight bits is made available. In the simplest case, there is the "dual mode", wherein two bits are delivered with each addressing. The data stored in the interim register are made available serially at the data output of the memory using the shift register.

In DRAM memories of the appertaining construction, the nibble mode is activated in that the row address strobe $\overline{RAS}$ is on Low and the column address strobe $\overline{CAS}$ is switched to High, whereby the data output is blocked, and the column address strobe $\overline{CAS}$ subsequently placed on Low again. Thereby the next data bit is then requested. In heretofore known memory types, this operation can be repeated every 55 or 65 nsec so that, with a suitably constructed drive circuit, a maximum data rate of 14 to 16 Mhz can be expected. Due to the strobing of the voltage at the $\overline{CAS}$ terminal, access to four successive bits in the nibble mode becomes possible. Then, the row address strobe $\overline{RAS}$ can be switched to High, to start a new access cycle. By re-applying the row and column addresses, four cells are again read out. Random data access thus remains possible. An essential advantage of the nibble mode is a faster readout in comparison with the heretofore conventional serial operation, i.e. the page mode operation.

In DRAMs operating with the nibble or with the byte mode, the stored data can be read out in short cycle succession serially with the $\overline{CAS}$ alone, as has just been noted. But since the minimum $\overline{CAS}$-LOW time, that is, the time spent $t_{NAS}$ (32 CAS-LOW time is nibble mode) equals the maximum access time $t_{NAC}$, the storage time $t_{OFF}$ heretofore provided at the data output is not sufficient to data evaluation, as had been found on the basis of the studies which led to the present invention. It should be noted in this connection also that this storage time $t_{OFF}$ is not specified in a finite minimum value in the heretofore known memories of the type suitable for nibble mode but rather usually by $t_{OFF\ min}$=zero nsec. For these reasons, it is generally not possible with the heretofore known memories according to the definition given at the introduction hereto to utilize the minimum cycle time $t_{NC\ min}$. The invention is based upon the finding that, by means of a controlled prolongation of the storage time of the data output only for the nibble and the byte, respectively, that is prolongation of the time span $t_{NOFF}$, as well as by the specification of a minimum value $t_{NOFF\ min}$ for this time span, the user is given the possibility of evaluating the output data even though the time span $t_{NAS}$ is minimal. The effective minimum cycle time $t_{NC}$ in the nibble mode can thereby be reduced further.

It is accordingly an object of the invention to provide an integrated semiconductor circuit which will reduce the effective minimum cycle time in the nibble mode.

With the foregoing and other objects in view, there is provided, in accordance with the invention, an integrated semiconductor circuit with a dynamic read-write memory corresponding to the definition given at the introduction hereto, wherein control of the data output via the column address strobe $\overline{CAS}$ is, according to the invention, is constructed in such a manner that the information present at the data output and made available by the shift register is preserved at the data output of the memory after decay of the column address strobe signal $\overline{CAS}$ causing its readout for a defined time span to last, if necessary or desirable, until the next column address strobe signal $\overline{CAS}$ in sets in.

Other features which are considered as characteristic for the invention are set forth in the appended claims.

Although the invention is illustrated and described herein as embodied in integrated semiconductor circuit with a dynamic read-write memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a time diagram conventional for nibble mode of operation; and

FIG. 2 is a simplified block diagram for a DRAM memory in the current state of the art to which the time diagram of FIG. 1 is applicable;

Figure 3:
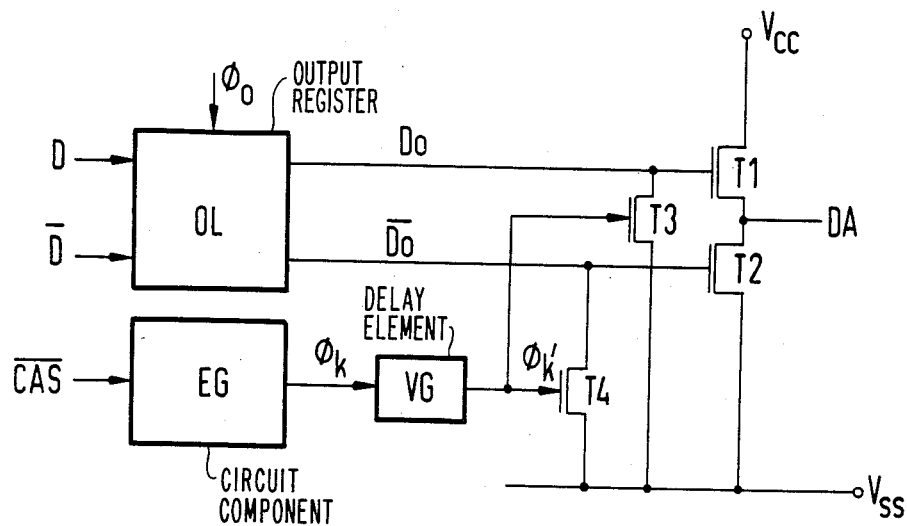
FIG. 3 is a schematic block diagram of an output driver OLB forming part of the integrated semiconductor device according to the invention.
Figure 3A:
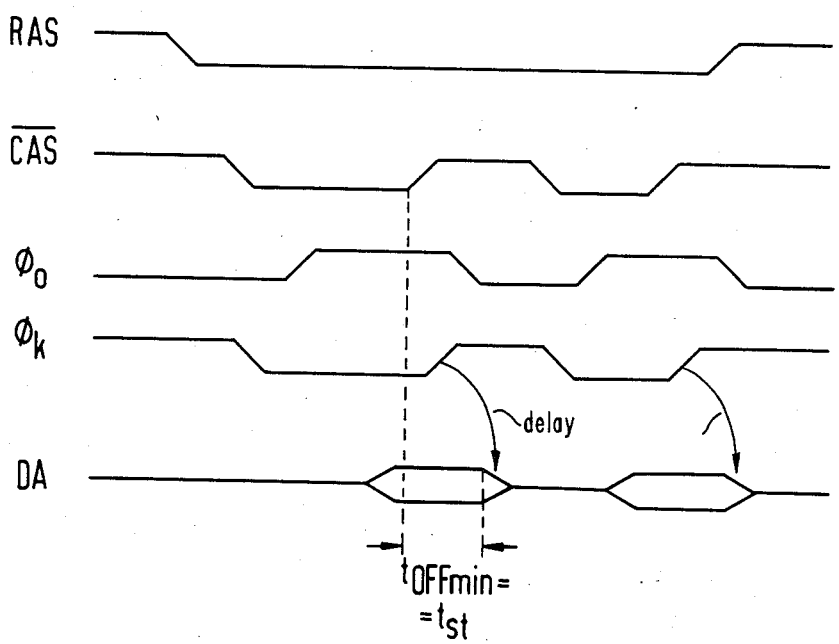
FIG. 3a is a time diagram applicable to the device of FIG. 3.

As noted, FIGS. 1 and 2 refer to the state of the art, while the other figures deal with various embodiments of the invention.

Referring now to the drawing and first, particularly, to FIGS. 1 and 2 thereof representing the state of the art, there is shown in FIG. 1 a time diagram customary for the nibble mode, and in FIG. 2 a simplified block diagram for a DRAM memory customary therefor.

With regard to the time diagram according to FIG. 1 which is valid for the conventional constructions of DRAMS with nibble by byte modes, it should be noted that an address is fed or applied and, by strobing the $\overline{CAS}$ line four times (that is, by four $\overline{CAS}$ pulses successively generated after occurrence of the $\overline{RAS}$ pulse), the data output is opened four times, as is indicated by the time slots "g" (=valid). The heretofore known general circuit for this purpose according to FIG. 2 is driven by four pairs of data lines $O_o, \overline{O}_o, O_1, \overline{O}_1 \ldots O_3, \overline{O}_3$ of the actual cell field, that is, of a memory matrix SP which are connected by the column address decoders with four bit lines.

Respective pairs of associated data outputs $0_x, \overline{O}_x$ of the memory matrix SP serve to drive one of four circuit sections I, II, III and IV, respectively, which are identical, so that, in the drawing, the components essential for the nibble mode are indicated in only one of these circuit sections, namely I. The components include an interim register Rg with two signal inputs, which are controlled by two outputs $0_x, \overline{O}_x$ belonging together (hence always carrying mutually inverted signals). In addition, due to the data state maintained in the interim register Rg of the respective circuit section, the drive of one current-carrying terminal of one n-channel MOS FET t, respectively, is given, the second current-carrying terminal of which is connected to a respective one of the two inputs D and $\overline{D}$ of the common output driver stage OLB. One input D is acted upon by the data obtained based upon the addressing and actually stored in the addressed cells, while the other input $\overline{D}$ is acted upon by the inverted D. (The data D corresponds to the data supplied by the output $0_o, 0_1, 0_2$ and $0_3$ of the memory matrix SP, while the data $\overline{D}$ originate from the outputs $\overline{O}_o, \overline{O}_1, \overline{O}_2$ and $\overline{O}_3$, inverted with respect thereto, of the memory matrix SP).

Also provided as an essential feature is a four-bit cyclic shift register RS with the stages S1, S2, S3 and S4, which is strobed by the column address strobe $\overline{CAS}$, the individual stages S1 to S4 thereof being provided with control data via a 1:4 decoder DK controlled by a supplementary address ZA. The data-carrying output of the individual register stages S1 to S4 serves to control the gates of each of the transistor pairs t provided in each of the aforementioned circuit sections I to IV and, hence, to control the data flow to the output driver OLB. Besides the driver function, the latter also contains the function of level adaptation e.g. for the operation of a TTL logic. The data output DA is given by the output of the circuit component OLB.

An objective of the invention is to improve the heretofore known memory circuit in such a way that the time intervals g (=valid) visible in FIG. 1 are maintained at the data output DA for a limited, defined period, despite the switching of the column address strobe $\overline{CAS}$ to HIGH, evident from FIG. 1 at least for certain modes of operation of the memory. To this end, it is desirable to start with the heretofore known construction of the output driver OLB and to complete it by additional circuit parts which assure the intended effect of the invention. A first realization or embodiment of such added circuitry in accordance with the invention is described hereafter with reference to FIGS. 3, 3a, 3b and 3c.

In the construction illustrated in FIG. 3 for the output driver OLB, there is provided an output register OL (=output latch controlled by the two data inputs D and $\overline{D}$ which, moreover, is controlled by a clock $\phi_o$. For this purpose, there may be used, for example, a flip-flop strobed by the clock $\phi_o$, especially a D-latch. The OL outputs carrying the data signal Do to be evaluated and the inverted signal $\overline{Do}$ serve to control the gate of the two MOS field effect transistors T1 and T2 connected in series. One current-carrying terminal of this series connection is connected to the supply potential $V_{CC}$ and is given by the drain of the MOS field effect transistor T1 controlled by the output Do of the output register OL carrying the data signal to be evaluated. The second current-carrying terminal of this series connection is given by the source terminal of the MOS field effect transistor T2 controlled by the output $\overline{Do}$ of the output register OL carrying the inverted data signal and is connected to the reference potential $V_{SS}$. The data output DA of the memory lies between the two transistors T1 and T2 of the series connection.

Two additional MOS field effect transistors T3 and T4 serve to discharge one of the two data outputs Do and $\overline{Do}$, respectively, of the output register OL and hence of the gate of the output transistor T1, T2 controlled by the respective data output Do, $\overline{Do}$. In the case of the embodiment of FIG. 3, the output Do is connected to the reference potential $V_{SS}$ via the source-drain path of the discharge transistor T3, and the output $\overline{Do}$ via the source-drain path of the discharge transistor T4. The gates of the transistor T3 and T4 are controlled by a common clock $\phi'_k$, which is supplied by a circuit arrangement which, in turn, is controlled by the column address strobe $\overline{CAS}$.

This circuit arrangement is made up of a circuit component EG, which is driven by the column address strobe $\overline{CAS}$ and, in turn, delivers a clock pulse $\phi_k$ to a delay element VG. The clock pulse $\phi'_k$ needed for the control of the two discharge transistors T3 and T4 then appears at the output of this delay element VG. It has been found that the effect aimed at by the invention is brought about precisely by the use of the delay element VG whereas, the absence of this delay element VG, the pulses $\phi_k$ delivered by the circuit component EG, the so-called discharge generator, would, if they were used directly for the control of the two charge transistors T3 and T4, lead merely to the time effects connected with the nibble mode control employed heretofore. The invention can be realized, however, also in a way other than by a delay element VG.

It should also be mentioned that the two output transistors T1 and T2 as well as the two discharge transistors T3 and T4 are self-locking transistors of the same channel type, especially of the n-channel type, this being true in general also of the other parts of the memory as well as of the circuit parts provided in FIG. 3.

The two output transistors T1 and T2, with the circuit node lying between them and forming the output DA, for an output buffer operating in the tri-state mode. By means of the clock pulse $\phi_o$ controlling the output register OL, the data coming from the memory matrix SP arrive at the output buffer T1, T2. By the clock $\phi'_k$, the outputs Do and $\overline{Do}$ of the output register OL and hence the gate of the output transistors T1 and T2 are pulled to Low i.e. to the reference potential $V_{SS}$, owing to which the data output DA gets into the tri-state condition. The respective time diagram can be seen in FIG. 3a.

In the case at hand, the delay element VG is preferably set to a delay time of 15 nsec and is formed, for example, of an even number of successive inverters, constructed for example with the use of n-channel MOS FETs with self-locking driver transistors. They are formed, for example, of a driver transistor having a source which is connected to the reference potential $V_{SS}$ and a gate which forms the inverter input and a drain terminal which forms the signal output of the inverter, the driver transistor being connected via an output transistor to the supply potential $V_{DD}$ or $V_{CC}$. If the output transistor is of the same type as the driver transistor, its gate is connected to its drain. But if the output transistor is of the self-conducting type, its gate is preferably connected to the output of the respective inverter.

Figure 3B:
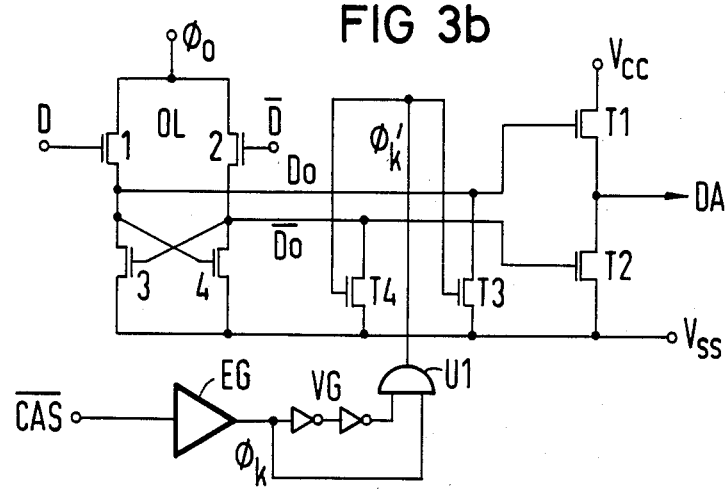
FIG. 3b is a fragmentary circuit diagram of FIG. 3 showing the composition of the output register OL and the circuit part EG in greater detail.

With respect to a possible construction of the output register OL and of the circuit part EG controlled directly by the column address strobe $\overline{CAS}$ to produce the clock $\phi_k$ to be applied to the delay element VG, reference may be made to FIG. 3b, which, with respect to the generation of the pulses $\phi'_k$ jointly controlling the discharge transistors T3 and T4, is a further development over the arrangement shown in FIG. 3. In the embodiment shown in FIG. 3b, the output register OL is made up of a flip-flop, which is formed by the cross-coupled MOS field effect transistors 3 and 4 and the two output transistors 1 and 2. The source terminals of the two cross-coupled MOS FETs 3 and 4 are connected to the reference potential $V_{SS}$, and the drain terminal of the transistor 3 as well as the gate terminal of the transistor 4 are connected to the source of the output transistor 1, while the drain terminal of the transistor 4 and the gate terminal of the transistor 3 are directly connected to the source of the output transistor 2. The drain terminals of the two output transistors are addressed by the aforementioned clock signal $\phi_o$, while the gate of the first output transistor 1 is addressed by the data input D and the gate of the second output transistor 2 by the inverted data input $\overline{D}$. Consequently the circuit node lying between the transistor 3 and the first output transistor 1 forms the output Do for the non-inverted data signal, and the node between the transistor 4 and the second output transistor 2 forms the output $\overline{Do}$ for the inverted data signal. The construction shown in FIG. 3b for the output register OL can be used for the construction according to FIG. 3 as well as for the construction according to FIG. 4.

With respect to the actuation of the tri-state output T1, T2 and the connection of the discharge transistors T3 and T4 to the outputs Do and $\overline{Do}$, there is no difference therein from the rest of the described embodiments of the invention. The transistors in the output register OL are again self-locking transistors of the same channel conduction type as the transistors T1 to T4.

The circuit section EG i.e. the discharge generator, which is provided for generating the control of the delay element VG is given, for example, by a MOS amplifier of known construction, the input of which is addressed by the column address strobe $\overline{CAS}$, and which has an output providing the clock signal $\phi_k$ for driving the delay element VG. As has been indicated hereinabove, the delay element VG is formed, in the illustrated embodiment of FIG. 3b, of two serially connected MOS inverters of conventional construction. The output of the second inverter is connected directly to the one input of an AND gate U1, while the second input of this AND gate U1 is controlled directly by the output of the circuit component EG, that is, by the pulses $\phi_k$. At the output of this AND gate U1, there appear the pulses $\phi_k$ which serve to control the discharge of the two data outputs Do and $\overline{Do}$ and the gate of the two output transistors T1 and T2 through the intermediary of the transistors T3 and T4.

The AND gate U1 provided in the embodiment of FIG. 3b ensures that only the upward edge of the pulse $\phi'_k$ is delayed relative to the pulse $\phi_k$, while the downward edge undergoes no such delay. In addition, prevention of the ouputs Do, $\overline{Do}$ of the output register OL from being pulled to the LOW level by the clock $\phi_o$ is sought after, and can be achieved in various ways. One possibility, in the construction according to FIG. 5b, is to use additional clock controls $\phi_C$ and $\overline{\phi}_C$.

Figure 3C:
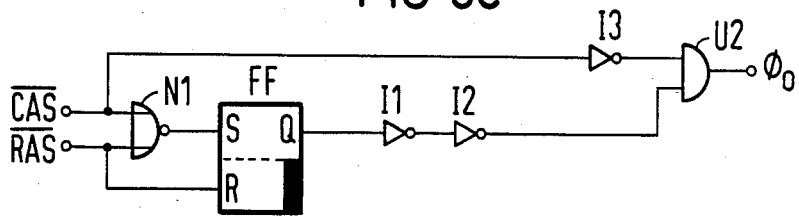
FIG. 3c is a logic circuit diagram for a clock pulse $\phi_o$ generator for controlling the output register OL of FIG. 3b.

With respect to one possibility of generating the clock pulses $\phi_o$ needed for the control of the output register OL, reference is made to FIG. 3c wherein the row address strobe signals $\overline{RAS}$ are connected to one signal input and the column address strobe signals $\overline{CAS}$ to the other signal input of a NOR gate N1. The output of this NOR gate N1 controls the setting input of a flip-flop FF e.g. an RS flip-flop having a reset input which is actuated by the row address strobe signals $\overline{RAS}$. The output Q of the flip-flop FF supplying the non-inverted signal is connected via a delay element I1, I2 to the one input of an AND gate U2. The second input of this AND gate U2 is controlled by the output of an inverter I3, having an input which is actuated by the column address strobe signal $\overline{CAS}$ directly. The signal output of the AND gate U2 furnishes the desired clock pulses $\phi_o$, which are used for the clock control of the output register OL, for example in the manner shown in FIG. 3b. They are also used in the same manner as in FIG. 3b for the control of the construction for the output register OL* used in the construction according to FIGS. 5, 5a and 5b, as can be seen from FIG. 5b.

The circuit illustrated in FIG. 3c for the generation of the clock pulses $\phi_o$ ensures that, after the row address strobe $\overline{CAS}$ has gone to LOW, the first $\phi_o$ pulse goes to HIGH with a time delay relative to the column address strobe $\overline{CAS}$. During this time, the data are read out of the memory cells in the matrix SP and stored in the interim register Rg (note FIG. 2). The following $\phi_o$ pulses have only a slight delay relative to $\overline{CAS}$.

Figure 4:
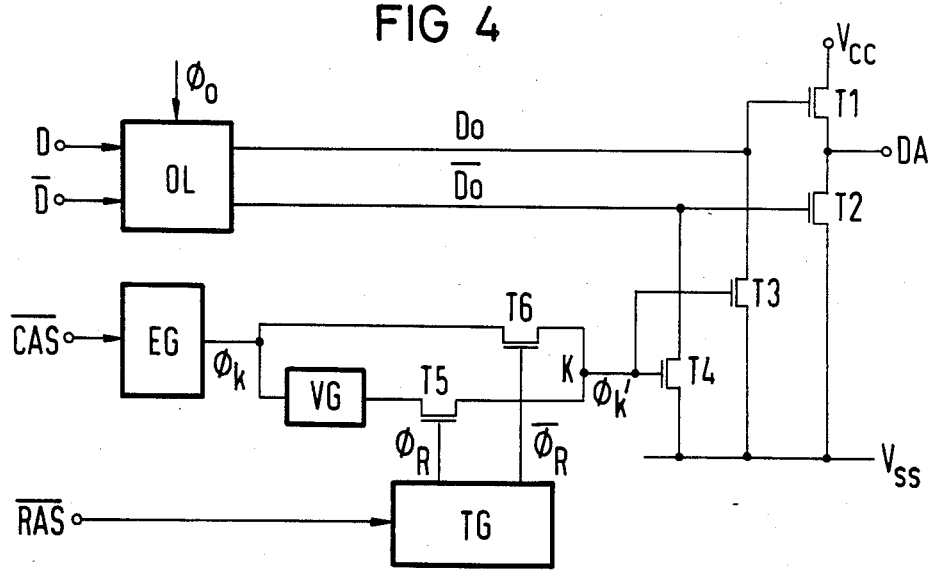
FIG. 4 is a schematic block diagram of another embodiment of FIG. 3.
Figure 4A:
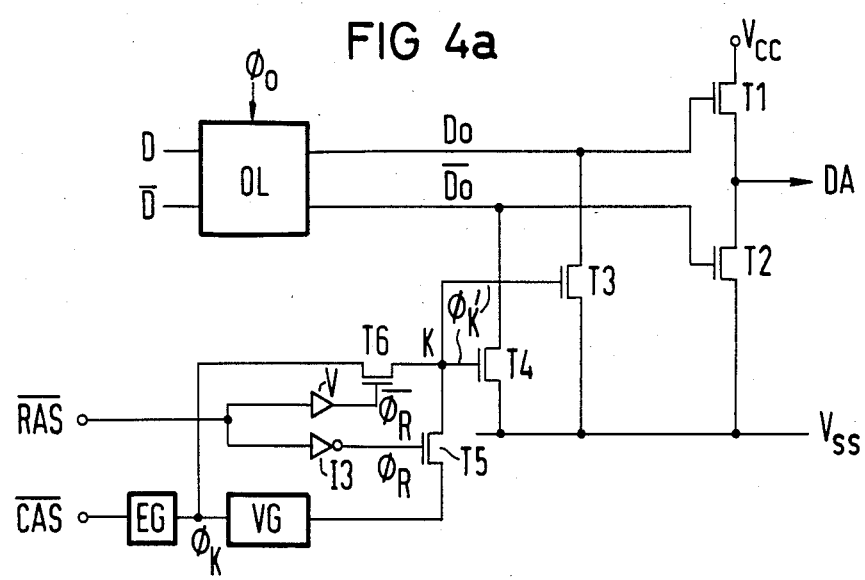
FIG. 4a is a fragmentary circuit diagram of FIG. 4 showing the composition of the output register OL and the circuit part EG in greater detail.
Figure 4B:
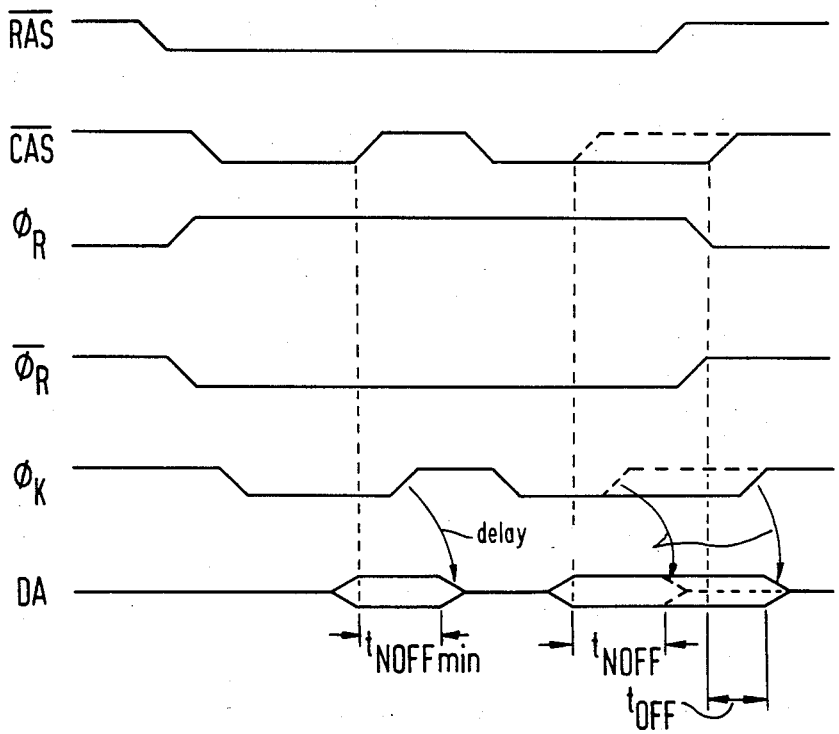
FIG. 4b is a time diagram applicable to FIG. 4.

In the construction of an output stage OLB corresponding to the invention as illustrated in FIGS. 4 and 4a, respectively, the basis therefor is again the version shown in FIG. 3. In this regard, the following behavior is sought after:

A controlled prolongation of the storage time of the date output DA (i.e. of the two output transistors T1 and T2), indeed limited to the case wherein the memory circuit is operated in the nibble mode or in the byte mode, is desired. This means that such a prolongation of the storage time exists only if, upon disconnection of the data output DA by the column address strobe $\overline{CAS}$, the row address strobe $\overline{RAS}$ is on LOW, as can be seen specifically from the time diagram of FIG. 4b. In this regard, the hitherto customary short storage time for normal operation with the row address strobe $\overline{RAS}$ on HIGH is to be maintained. For the case of operation in nibble mode or in byte mode the condition (note FIG. 4b), $$t_{NOFF} \geqq t_{ST}$$

and in normal operation with $\overline{RAS}$=HIGH $$t_{OFFmin} < t_{NOFFmin}$$

is to be fulfilled. In this regard, $t_{NOFF}$ is the time span until the data output DA is turned off and starting with the transition of the column address strobe signal from LOW to HIGH, the row address strobe $\overline{RAS}$ being on LOW likewise. If, however, the row address strobe $\overline{RAS}$ is on HIGH during turnoff of the data output DA, the aforestated delay does not become operative. The time span corresponding thereto is designated by "$t_{OFF}$" in FIG. 4b.

The circuit shown in FIG. 4 for the output driver OLB differs from the circuit according to FIG. 3 or 3b only by a different structure of the part of the output circuit OLB serving to generate the clock $\phi'_k$ which controls the gates of the two discharge transistors T3 and T4. The pulse $\phi_k$ supplying output of the circuit section EG active as discharge generator and controlled in turn by the column address strobe $\overline{CAS}$ is connected to a circuit node K, on the one hand, via the series connection of the delay element VG and the source-drain path of a transfer transistor. On the other hand, the same output of the discharge generator EG is likewise connected to the node K via a second transfer transistor T6. For the control of the gate of the two transfer transistors T5 and T6, a circuit TG which is controlled by the row address strobe $\overline{RAS}$ and which furnishes two mutually inverted clock signals $\phi_R$ and $\overline{\phi}_R$ is provided. One clock signal $\phi_R$ serves for the control of the transistor T5 and hence for the connection between the output of the delay element VG and the node K. The other clock signal $\overline{\phi}_R$, inverted relative to the first clock signal $\phi_R$, serves for the control of the transfer transistor T6 and hence for the control of the direct connection between the output of the discharge generator EG and the node K. At this node, a superposition of the pulses delivered at the output of the delay element VG with the pulses $\phi_k$ supplied by the discharge generator EG occurs. Through this superposition, the pulses serving to control the gate of the two discharge transistors T3, T4 are formed. The waveform of the pulses $\phi_R$ and $\overline{\phi}_R$ in relation to the other pulses, especially the pulses RAS and $\overline{CAS}$, can be seen from the time diagram according to FIG. 4b.

A simple method for generating the pulses $\phi_R$ and $\overline{\phi}_R$ required for the strobing of the two transfer transistors T5 and T6 is shown in FIG. 4a. In this method, to generate the $\overline{\phi}_R$ pulses required for the control of the transfer transistor T6 forming the connection between the node K and the output of the discharge generator EG, the row address strobe $\overline{RAS}$ is connected via a non-inverting MOS amplifier V to the gate of transistor T6. On the other hand, to control the gate of the transfer transistor which forms the connection between the output of the delay element VG and the node K, a clock $\phi_R$ is used which is formed by the actuation of an inverter I3 by the row address strobe $\overline{RAS}$. The amplifier V may be constituted, for example, (corresponding to the delay element VG of FIG. 3b) by two serial connected inverters. But if it is desired to match the control of the two transfer transistors T5 and T6 in time, the version evident from FIG. 4c and FIG. 4d, for example, is advisable, FIG. 4c representing the circuit for the inverter I3 provided in the realization or embodiment according to FIG. 4a, and FIG. 4d representing the circuit for the amplifier V.

Figure 4C:
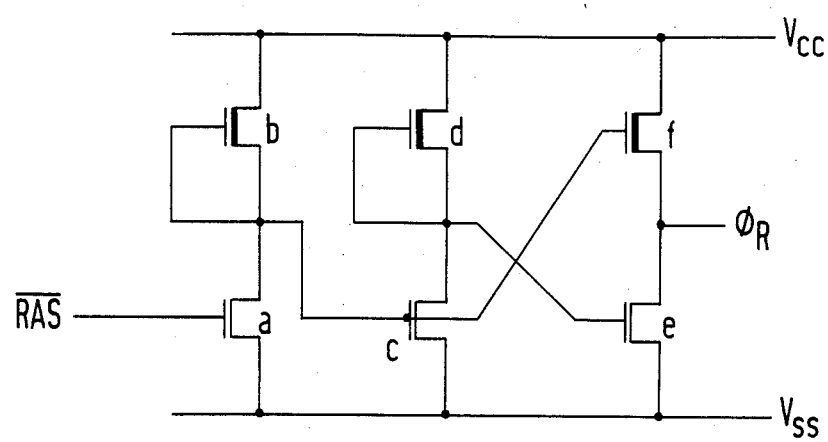
FIG. 4c is a fragmentary circuit diagram of FIG. 4a showing the inverter I3 in greater detail.
Figure 4D:
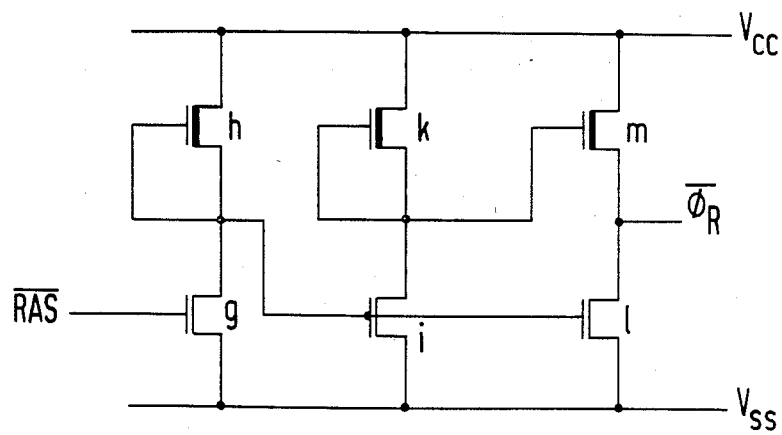
FIG. 4d is a fragmentary circuit diagram of FIG. 4a showing the amplifier V in greater detail.

Because the circuits shown in FIGS. 4c and 4d involve common possibilities of realizing an inverting amplifier and a non-inverting amplifier in MOS technology with equal delay time, and because the effect sought after is readily evident, it is believed to be unnecessary to give a detailed description of FIGS. 4c and 4d. It should be mentioned only that the transistors b, d, f, h, k, m having a drain connected to the supply potential are of the depletion type and the remaining transistors a, c, e, g, i, l are of the enhancement type. The first two stages, a, b, c, d, on the one hand, and g, h, i, k, on the other hand, respectively, form an amplifier, while the output stages f, e, on the one hand, and m, l, on the other hand, respectively, are controlled by the first two stages in the manner shown in FIGS. 4c and 4d.

The embodiments of the invention described hereinbefore are all based on the fundamental structure evident from FIG. 3. The forms of the output driver OLB corresponding to the invention to be described hereinafter with reference to the following figures have only the tristate output T1, T2 and the two discharge transistors T3 and T4 for the gate of the transistor T1 or T2 in common with the constructions described with reference to FIG. 3 and so forth. With respect to the construction of the output register with the data inputs D, $\overline{D}$ and the generation of the control pulses for the two discharge transistors, however, there are some differences.

Figure 5:
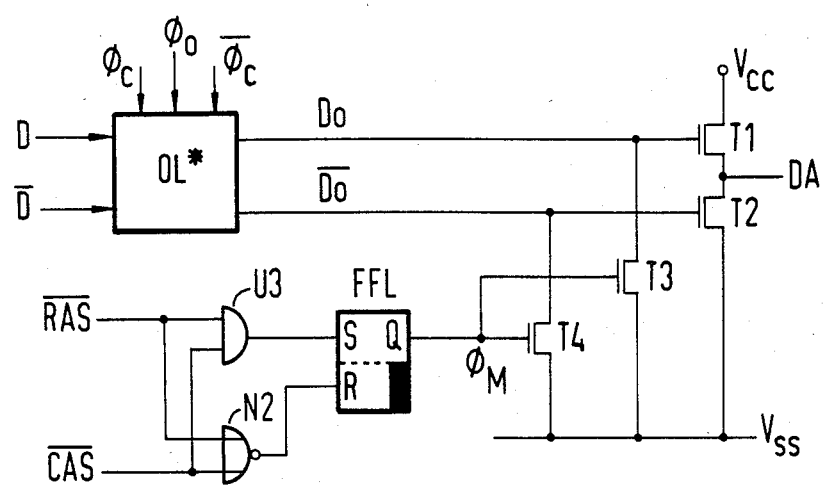
FIG. 5 is a schematic block and logic circuit diagram of a third embodiment of an output driver OLB of a DRAM memory according to the invention.

The embodiment illustrated in FIG. 5 of the output OLB of a DRAM memory according to the invention is of such construction that the following behavior is assured.

In nibble mode or in byte mode operation, although the column address strobe $\overline{CAS}$ is on HIGH in the nibble mode, the data output DA must, nevertheless be kept available, namely until the column address strobe $\overline{CAS}$ goes on LOW again, thereby starting a new nibble-mode and byte-mode cycle, respectively. In the meantime, there is to be either no tristate phase of the data output DA at all or, due to the switching, only a short tristate phase. In addition, at the end of the respective read cycle (i.e. when both the column address signal $\overline{CAS}$ and the row address signal $\overline{RAS}$ are on HIGH), the address pulse which will later be on HIGH is to turn off the data output DA, this being possible, for example, by means of an AND linkage.

In the construction of the data output part OLB shown in FIG. 5, and which produces the behavior just indicated, there is sued as output register OL*, instead of the previous register OL, a flip-flop controlled both by the pulses $\phi_o$ and by two mutually inverted further pulse sequences $\phi_c$ and $\overline{\phi}_c$, illustrated in detail in FIG. 5b. Besides the signal inputs required for the strobing and the two mutually inverted data inputs D and $\overline{D}$, this output register likewise has two mutually inverted data outputs Do and $\overline{Do}$, of which the output Do carrying the non-inverted output signal controls the gate of the MOS FED T1 connected to the supply potential $V_{CC}$ while the other output $\overline{Do}$ controls the gate of the MOS FET of the tri-state output T1, T2 connected to the reference potential $V_{SS}$. Both data outputs Do and $\overline{Do}$ are in turn connected to the reference potential $V_{SS}$ via a discharge transistor T3, T4. The gates of the two discharge transistors T3 and T4 are controlled jointly by a discharge pulse $\phi_M$.

Both the new address strobe $\overline{RAS}$ and the column address strobe $\overline{CAS}$, for joint control of an AND gate U3 as well as for joint control of a NOR gate N2, are used for generating the discharge pulses $\phi_M$ in the data output circuit according to the invention illustrated in FIG. 5. The output of the AND gate U3 is connected to the set input and the output of the NOR gate N2 to the reset input of a common RS flip-flop FFL, the non-inverting output Q of which furnishes the pulses $\phi_M$ required for controlling the gates of the two discharge transistors T3 and T4.

Figure 5A:
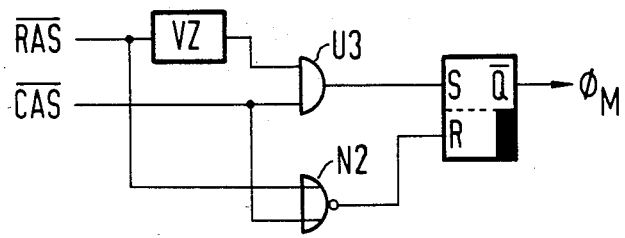
FIG. 5a is a fragmentary view of FIG. 5 showing a modified construction including a delay element VZ interposing the row address strobe $\overline{RAS}$ and the AND gate U3.
Figure 5B:
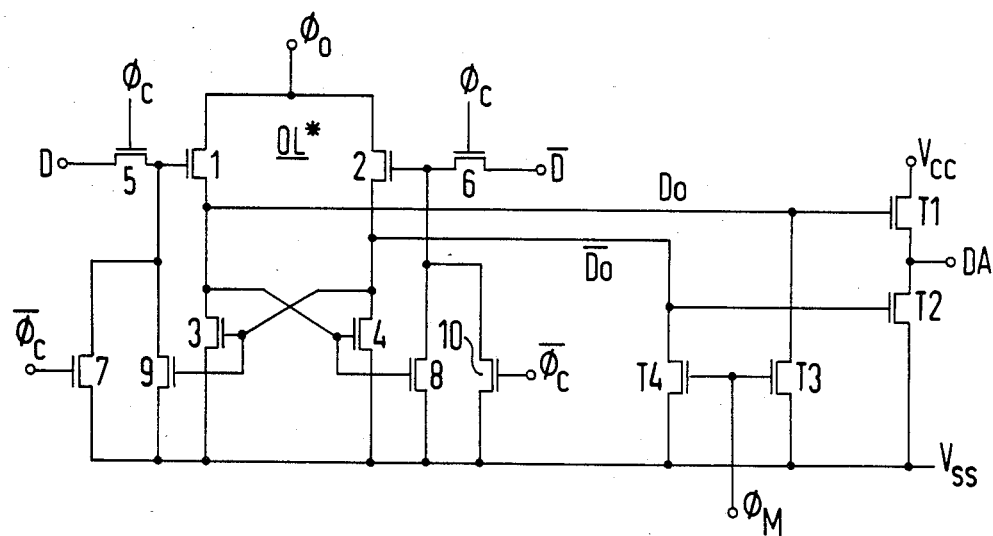
FIG. 5b is a fragmentary circuit diagram of FIG. 5 showing the composition of the output register OL in greater detail.
Figure 5C:
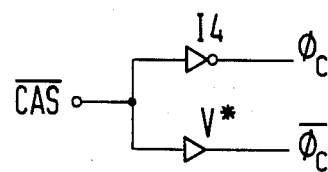
FIG. 5c is a simplified circuit diagram for providing mutually inverted clock sequences $\phi_c$ and $\overline{\phi}_c$ by the column address strobe $\overline{CAS}$ to the circuit of FIG. 5b.
Figure 5D:
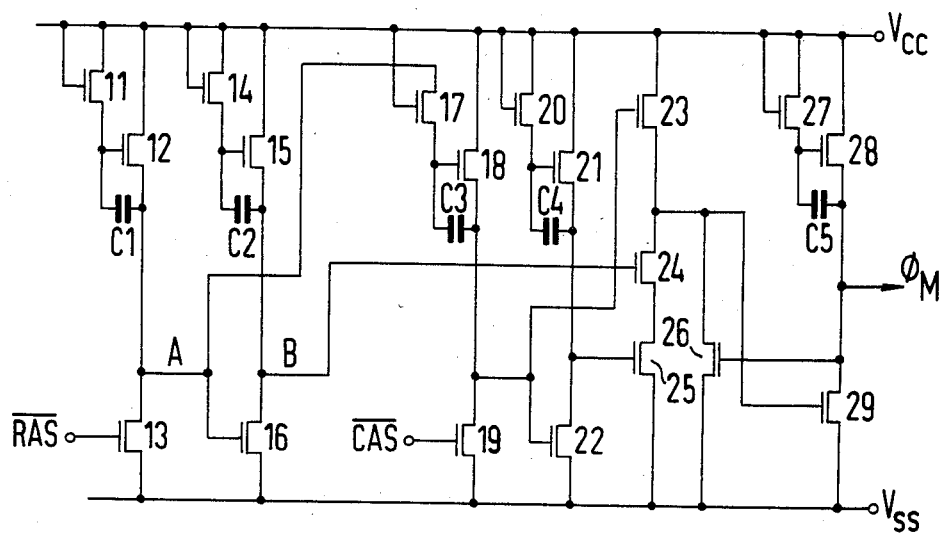
FIG. 5d is a diagram of a circuit for generating the clock $\phi M$ generally in concordance with the circuit of FIG. 5.
Figure 5E:
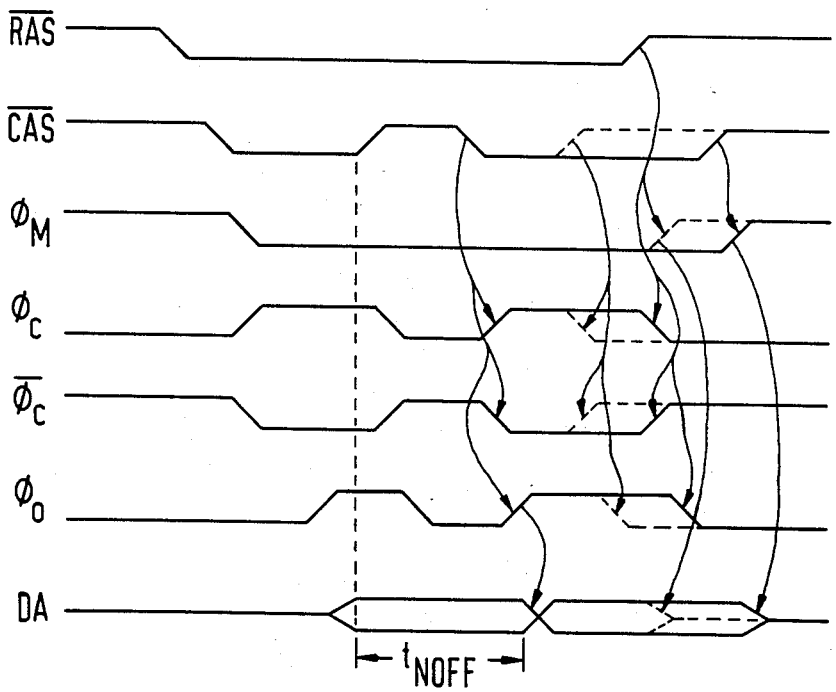
FIG. 5e is a time diagram applicable to FIG. 5.

The time diagram for the circuit according to FIG. 5 is illustrated in FIG. 5e. To generate the clock pulses $\phi_o$, one can use the circuit discussed hereinbefore with reference to FIG. 3c, while for the generation of the clock pulses $\phi_c$ and $\overline{\phi}_c$, one can proceed in accordance with FIG. 5c. In FIG. 5c, an inverter I4 having an input actuated by the column address strobe $\overline{CAS}$ is provided for the generation of the clock $\phi_c$. For generating the inverted clock, an amplifier V* driven by the column address strobe $\overline{CAS}$ on its input side is available. Here, too, in the interest of equal delay times, one can use the MOS circuit shown in FIG. 4c for the inverter I4, and the MOS circuit shown in FIG. 4d for the amplifier V*.

The circuit shown in FIG. 5 can be developed with respect to the arrangement serving for the generation of the discharge clock $\phi_M$ by connecting the row address strobe $\overline{RAS}$ via a delay element VZ to the AND gate U3, while, as FIG. 5a shows, the circuit used in FIG. 5 for driving the RS flip-flop FFL remains otherwise unchanged. This delay element VZ may, in turn, be constituted by two inverters connected in series. As can readily be seen, the delay element VZ has the result of subjecting the cutting off of the data signal present at the data output DA to a further delay by means of the row address strobe $\overline{RAS}$.

FIG. 5b shown the circuit for the output register OL*, as is required in connection with FIG. 5. Here, too, the core is the flip-flop OL formed of the transistors 1 to 4 according to FIG. 3b, for the output register OL. To achieve the desired timing illustrated in FIG. 5e, however, additional MOS field effect transistors 5 to 10 of the same type as the transistors 1 to 4 as well as T1 to T4 (i.e. of the enhancement type with identical channel doping) are provided. In addition, one needs the two clock sequences $\phi_C$ and $\overline{\phi}_C$, which can be produced mutually inverted and, as mentioned hereinbefore, by means of a circuit according to FIG. 5c by means of the column address strobe $\overline{CAS}$.

As can be seen from FIG. 5b, the data input D is connected via a transfer transistor 5 controlled by the clock $\phi_C$, on the one hand, to the gate of the transistor 1 of the flip-flop and, on the other hand, via two MOS FETs 7 and 9 connected in parallel with each other to the reference potential $V_{SS}$. In like manner, the data input $\overline{D}$ addressed by the inverted data signal is connected via a transfer transistor 6, likewise controlled by the clock $\phi_C$, on the one hand, to the gate of transistor 2 of the flip-flop and, on the other hand, to the reference potential $V_{SS}$ through the parallel connection of the two MOS FETs 8 and 10. Of the two transistors 7 and 10 in the embodiment of FIG. 5b of the two last-named parallel connections 7, 9 and 8, 10, respectively, one thereof is controlled by the inverted clock signal $\overline{\phi}_C$. The gate of the respective other MOS field effect transistor of the parallel connection is connected to that data output $\overline{Do}$ and Do, respectively, of the output register OL* belonging to that one of the two data inputs D and $\overline{D}$, respectively, which is applied via the the series connection of its respective input transistor 5 and 2 to the reference potential by the appertaining transistor parallel connection 7, 9 and 8, 10, respectively.

FIG. 5d shows a single channel MOS circuit for the generation of the discharge clock $\phi_M$ which, in principle, is in concordance with the circuit indicated in FIG. 5 for the generation of the clock $\phi_M$.

The circuit shown in FIG. 5d for the generation of the clock $\phi_M$ is formed of the transistors 11 to 29 and five capacitors C1 to C5. The transistors are of the same channel type as the other transistors used in the circuit and are preferably self-locking.

In this circuit, the row address strobe $\overline{RAS}$ controls the first transistor 13 of this circuit, which by its source is connected to the reference potential $V_{SS}$ and by its drain to to the supply potential $V_{CC}$ via a bootstrap load formed by the two MOS FETs 11 and 12 and by the capacitor C1. This creates an inverter effect, the output signal having a High output level, however, which is equal to the supply voltage.

A second bootstrap inverter stage is constructed in the same manner as is the first bootstrap inverter stage and is controlled at the gate of its driver transistor 16 by the output A of the first inverter stage. The bootstrap load made up of the two transistors 14 and 15 and the capacitor C2 corresponds to the first bootstrap inverter stage, as does the rest of the circuit.

A third bootstrap inverter has a driver transistor 19, which is controlled by the column address strobe $\overline{CAS}$. Moreover, the bootstrap load of this inverter is precharged via the MOS FET 17 forming an integral part of this load, via the drain thereof, by the output A of the first bootstrap inverter stage, in the manner indicated in FIG. 5d. Furthermore, the construction of the load member of the third inverter stage corresponds to the load construction in the other inverter stages of this circuit. A fourth bootstrap inverter is controlled at its driver transistor 22 by the output of the third inverter stage 19, 17, 18. With respect to the circuit of the bootstrap load, the first, second and fourth bootstrap inverter circuits are identical, while the third inverter stage is slightly different with respect to the control of the load by the output A of the first inverter, as can be seen from FIG. 5d. An inverter stage composed of the driver transistor 29 and the bootstrap load 27, 28 and C5 from the signal output of the circuit. The desired signal $\phi_M$ can be taken off at the drain of the driver transistor 29 of this fifth inverter stage.

The fifth inverter stage is controlled at its driver transistor by an input stage formed by the transistors 23 to 26 which, in turn, is controlled, on the one hand, by the output of the second inverter stage i.e. output B and, on the other hand, by the output of the third and fourth inverter stages, and is lastly coupled in negative feedback by the signal output of the fifth inverter stage. To this end, the transistor 23 of this intermediate stage, the drain of which is connected to the supply potential $V_{CC}$, is controlled by the output of the third inverter stage, that is, by the drain of the $\overline{CAS}$-controlled driver transistor 19, in that its gate is connected to this output. The drain of a transistor 26 is connected to the source of transistor 23 of the intermediate stage and has a source which is applied to the reference potential $V_{SS}$ and a gate which is connected to the drain of the driver transistor 92 of the last inverter stage. IN addition, the source of the transistor 23 of the intermediate stage is connected via the series connection of two additional transistors 24 and 25 to the reference potential, the transistor 25, which is connected directly to the reference potential, being controlled by the output of the fourth inverter stage, that is, by the drain of the driver transistor 22, while the transistor 24, which is connected directly to the source of the transistor 23, is controlled at its gate by the output of the second inverter stage, that is, by the drain of the transistor 16.

The hereinaforedescribed embodiments of the invention have the property of being realizable at low expense with respect to the strobing.

There are claimed:

1. Integrated semiconductor circuit with a dynamic read-write memory having a memory matrix composed of identical memory cells having information contents addressable via row and column decoders with respect to the individual memory cells, column lines, and data output, the addressing of the individual matrix rows being initiated by a row address strobe while the addressing of the individual matrix columns is initiated by a column address strobe, the addressing being such that during read-out, simultaneously, the information contents of a plurality of the memory cells intended for data storage is processed, transmitted to and temporarily stored in an interim register, and including, in addition, a shift register exclusively operated by the column address strobe for the serial transmission of the information contents in the interim register, simultaneously obtained from the memory matrix, to the data output of the memory, comprising means for controlling the data output of the memory via the column address strobe so that the information present at the data output of the memory and made available by the shift register is preserved at the data output of the memory after termination of the column address strobe signal causing presence of the information contents at the data output for a defined time span.

2. Semiconductor circuit according to claim 1 wherein the dynamic memory may operate in a nibble mode or in the Byte mode and wherein said plurality of memory cells is four or eight respectively.

3. Semiconductor circuit according to claim 1 comprising a memory output driver stage drivingly engaging said data output and driven by said interim register, which is connected via the column lines of the memory matrix with mutually inverted data signals in a manner controlled by the column address strobe, the output driver stage which comprises two identical output transistors as well as a strobe-controlled output register which transmits the information contents of the interim register to the two output transistors, said two output transistors forming a series connection, which is on the one side connected to a supply potential and, on the other side to a reference potential and having the data output between the two transistors, the gate of one of said output transistors being connected to an output lead of said output register which supplies the non-inverting data signal, the gate of the other output transistor being connected to the output lead of said output register which supplies the inverted data signal, both of said output leads of said output register being additionally connected to the reference potential via respective MOS discharge transistors, a common clock signal for controlling said discharge transistors and, a first pulse former actuated by the column address strobe for generating a first control clock cycle for both of said two discharge transistors, and an additional pulse former controlled both by the column address strobe and by the row address strobe for generating an additional clock cycle for said output register.

4. Semiconductor circuit according to claim 3 wherein, in said output register, a gate of a first MOS field effect transistor and a gate of a second MOS field effect transistor are each actuated by one of two inputs of said output register which carry the mutually inverted data signals, said first and second MOS field effect transistors being actuated in like manner by said clock cycle controlling said output register, a source terminal of each of said first and second MOS field effect transistors forming one of said two data outputs of said output register and being also connected to the drain of a respective additional MOS field effect transistor, said additional MOS field effect transistors having a source terminal connected to said reference potential and having respective gates each of which is connected to the drain of the respective other of said additional MOS field effect transistors.

5. Semiconductor circuit according to claim 4, including a NOR gate controlled both by the row address strobe and by the column address strobe for generating a signal for said clock cycle for controlling said output register for actuating a set input of an RS flip-flop having a non-inverting output connected, via a delay element to an input of an AND gate supplying said additional clock cycle, said AND gate having another input controlled by said column address strobe via an inverter and said reset of said RS flip-flop being connected directly to said row address strobe.

6. Semiconductor circuit according to claim 4 wherein said data inputs of said output register are constituted directly by the gate of a respective one of said two MOS field effect transistors driven at the drain thereof by said clock signal.

7. Semiconductor circuit according to claim 4 wherein said data outputs of said output register are constituted by the source terminal of a respective one of a pair of additional MOS field effect transistors having respective gates controlled by a common second clock signal, the drain terminal thereof being connected to the gate of one of said two MOS field effect transistors jointly controlled at their drain by said first control clock cycle; the gate of said last-mentioned MOS field effect transistors controlled by the first clock signal being connected to said reference potential via a parallel connection of two additional MOS field effect transistors, respectively; one of said MOS field effect transistors, respectively, of each of said two parallel connections being directly connected by its gate to the source terminal of that one of said two field effect transistors actuated by said first clock signal, said one of said last-mentioned transistors having a gate connected to said reference potential via the respective other parallel connection and including a common third clock signal for controlling said other two transistors, said third clock signal having a waveform which is inverted relative to said second clock signal.

8. Semiconductor circuit according to claim 7 wherein, for generating said second and third clock signals, said row address strobe is conducted via an inverter supplying said second clock signal and via a non-inverting amplifier supplying said third clock signal, respectively.

9. Semiconductor circuit according to claim 7, wherein said output register including said data output is constructed so that, in nibble mode as well as in the byte mode operation, said data output, despite cutoff of said column address strobe, remains available on HIGH, namely until said column address strobe goes on LOW again, thereby starting a new nibble or byte mode cycle; a tristate phase of said data output being present at most for a shorter period than the duration of the individual active phases of said column address strobe; and at the end of each read cycle, when both said row address strobe and said column address strobe are on HIGH, the address strobe, which terminates the active phase later and which reaches the level HIGH, switching said data output off.

10. Semiconductor circuit according to claim 9, comprising modified control pulses for controlling said two discharge transistors which connect said two data outputs of said output register are delivered by a non-inverting signal output of a flip-flop having a set input controlled by the output of an AND gate, and having a reset input controlled by the output of a NOR gate, said AND gate and said NOR gate being controlled jointly at two signal inputs thereof, respectively, both by said column address strobe and by said row address strobe.

11. Semiconductor circuit according to claim 10, wherein said AND gate as well as said NOR gate are controlled directly both by said column address strobe and by said row address strobe.

12. Semiconductor circuit according to claim 10, wherein said AND gate and said NOR gate are driven by said column address strobe directly; and also said NOR gate by said column address strobe directly while said row address strobe is applied via a delay element to the input of the AND gate assigned thereto.

13. Semiconductor circuit according to claim 9 including, for the purpose of generating clock pulses needed for controlling said two discharge transistors, an arrangement comprising five inverter stages with a bootstrap load and an intermediate stage, the driver transistor of a first bootstrap inverter stage being controlled by said row address strobe, and the driver transistor of a second bootstrap inverter stage by a signal output of said inverter stage formed by the drain of said driver transistor of said first bootstrap inverter stage; said first inverter stage with its output being provided for controlling a precharge of the bootstrap load of a third inverter stage and a driver transistor of said third inverter stage being controlled by said column address strobe; a fourth bootstrap inverter stage being controlled by the output of said third bootstrap inverter stage; an intermediate stage formed of three serially connected MOS field effect transistors, of which a first transistor thereof is connected by its drain to said supply potential and by its gate to the output of said third inverter stage controlled by said column address strobe, said first transistor having a source terminal forming the output of said intermediate stage and provide for controlling a final bootstrap inverter stage and being connected in a parallel connection with said reference potential both via an additional MOS field effect transistor revertively controlled by the output of said final inverter stage and via a series connection of two MOS field effect transistors; said bootstrap inverter stages being connected by their load to said supply potential and by their driver transistor to said reference potential, the output supplying said clock pulses needed for controlling said discharge transistors being constituted by the drain of said driver transistor of said final bootstrap inverter stage.

14. Semiconductor circuit according to claim 3 wherein an arrangement supplying said common clock signal serving for control of said discharge transistors and controlled by said column address strobe is formed of an input section and a delay element controlled by the output thereof, said input section being actuated directly by said column address strobe.

15. Semiconductor circuit according to claim 14 wherein said delay element is connected by its output directly to the gate of said two discharge transistors forming the connection between one output of said output register and said reference potential.

16. Semiconductor circuit according to claim 14, wherein said input circuit section—controlled by said column address strobe and included in said arrangement serving to generate said discharge pulses is connected by its output both directly and via a delay element to a signal input of an AND gate having an output connected to the gate of said two discharge transistors (T3, T4).

17. Semiconductor circuit according to claim 1 wherein said output register including said data output comprises timing means for extending said information present at the data output such that said data output is zero only when said column address strobe and said row address strobe are simultaneously LOW, and further such that said information present at the data output is not extended when the row address strobe is HIGH at the time the column address strobe is low.

18. Semiconductor circuit according to claim 17, including for actuating the gate of the two discharge transistors, a circuit node is actuated in one of two states A and B, namely in state A directly by the output of an input section, controlled in turn by said column address strobe, said input section being part of the arrangement which supplies said first control clock cycle pulses for controlling said discharge transistors and, in state B, by the output of a delay element by means of two transfer transistors, said gate of said two transfer transistors being controlled by mutually inverted pulses generated by said row address strobe by means of a pulse shaper.

19. Semiconductor circuit according to claim 18, wherein said pulse shaper comprises a non-inverting amplifier connected by its output to the gate of a first one of said two transfer transistors which controls the connection between the output of said input section and said circuit node and by an inverting amplifier connected by its output to the gate of a second one of said two transfer transistors which controls the connection between the output of said delay element and said circuit node, the input of said non-inverting and said inverting amplifier together being addressed by said row address strobe.

20. Semiconductor circuit according to claim 19, wherein said inverting amplifier and said non-inverting amplifier are adjusted to the same delay time.

21. Semiconductor circuit according to claim 1, wherein the parts of the circuits are produced with single channel MOS technology, and especially with n-channel MOS technology.

* * * * *